(12) United States Patent
Barak et al.

(10) Patent No.: US 6,587,511 B2
(45) Date of Patent: Jul. 1, 2003

(54) RADIO FREQUENCY TRANSMITTER AND METHODS THEREOF

(75) Inventors: Ilan Barak, Kfar Saba (IL); Jaime Hasson, Gane Tikva (IL)

(73) Assignee: Intel Corporation, Santa Clara, CA (US)

(*) Notice: Subject to any disclaimer, the term of this patent is extended or adjusted under 35 U.S.C. 154(b) by 26 days.

(21) Appl. No.: 09/769,444

(22) Filed: Jan. 26, 2001

(65) Prior Publication Data

US 2002/0131521 A1 Sep. 19, 2002

(51) Int. Cl.$^7$ ............................................. H03F 3/217
(52) U.S. Cl. ...................... 375/295; 330/127; 330/199; 455/13.4; 455/127; 455/522
(58) Field of Search ................................. 375/295–297; 455/91, 95, 115–117, 126, 127, 13.4, 522; 330/109, 129, 149, 126 R, 199, 127

(56) References Cited

U.S. PATENT DOCUMENTS

| | | |
|---|---|---|
| 3,777,275 A | 12/1973 | Cox |
| 4,433,312 A | 2/1984 | Kahn |
| 4,439,744 A | 3/1984 | Kumar et al. |
| 5,012,200 A | 4/1991 | Meinzer |
| 5,264,807 A | 11/1993 | Okubo et al. |
| 5,302,914 A * | 4/1994 | Arntz et al. ............ 330/124 R |
| 5,345,189 A | 9/1994 | Hornak et al. |
| 5,420,541 A | 5/1995 | Upton et al. |
| 5,541,554 A | 7/1996 | Stengel et al. |
| 5,548,246 A | 8/1996 | Yamamoto et al. |
| 5,568,094 A | 10/1996 | Bowen et al. |
| 5,621,351 A | 4/1997 | Puri et al. |
| 5,661,434 A | 8/1997 | Brozovich et al. |
| 5,694,093 A | 12/1997 | DaSilva et al. |
| 5,724,005 A | 3/1998 | Chen et al. |
| 5,739,723 A | 4/1998 | Sigmon et al. |
| 5,758,269 A | 5/1998 | Wu |

(List continued on next page.)

FOREIGN PATENT DOCUMENTS

WO   WO 99/52206   10/1999

OTHER PUBLICATIONS

U.S. patent application Ser. No. 09/579,528, Hasson et al., filed May 26, 2000.

U.S. patent application Ser. No. 10/026,677, Hasson et al., filed Dec. 27, 2001.

S. O. Ampem–Darko, H.S. Al–Raweshidy, "A Novel Technique for Gain/Phase Error Cancellation in LINC Transmitters", 1999 IEEE, pp. 2034–2038.

F.H. Raab, "Efficiency of Outphasing RF Power–Amplifier Systems", IEEE Transactions on Communications. vol. Com–33, No. 10, Oct. 1985, pp. 1094–1099.

S. C. Cripps, "RF power amplifiers for wireless communications", pp. 219–250.

D. C. Cox, "Linear Amplification with Nonlinear Components", IEEE Transaction on Communications, Dec. 1974, pp. 1942–1945.

Bob Stengel and William R. Eisenstadt, "LINC Power Amplifier Combiner Method Efficiency Optimization", IEEE Transaction on Vehicular Technology. vol. 49, No. 1, Jan. 2000, pp. 229–234.

Bob Stengel, "LINC Linear Transmitter Technology Review", Presented at International Microwave Symposium, Boston, MA, Jun. 11, 2000, pp. 1–32.

*Primary Examiner*—Amanda T. Le
(74) *Attorney, Agent, or Firm*—Eitan, Pearl, Latzer & Cohen Zedek, LLP.

(57) ABSTRACT

In one embodiment, the present invention provides a radio frequency transmitter that may have a processor and a controller that reduce current consumption of the power amplifier of the radio frequency transmitter.

26 Claims, 7 Drawing Sheets

U.S. PATENT DOCUMENTS

| | | |
|---|---|---|
| 5,786,727 A | 7/1998 | Sigmon |
| 5,854,571 A | 12/1998 | Pinckley et al. |
| 5,862,460 A | 1/1999 | Rich |
| 5,872,481 A | 2/1999 | Sevic et al. |
| 5,880,633 A | 3/1999 | Leizerovich et al. |
| 5,886,575 A | 3/1999 | Long |
| 5,901,346 A * | 5/1999 | Stengel et al. ............... 330/129 |
| 5,903,854 A | 5/1999 | Abe et al. |
| 5,909,643 A | 6/1999 | Aihara |
| 5,929,702 A | 7/1999 | Myers et al. |
| 5,974,041 A | 10/1999 | Kornfeld et al. |
| 6,133,788 A | 10/2000 | Dent |
| 6,201,452 B1 | 3/2001 | Dent et al. |
| 6,285,251 B1 * | 9/2001 | Dent et al. ............... 330/124 R |
| 6,330,455 B1 | 12/2001 | Ichihara |

\* cited by examiner

RADIO FREQUENCY TRANSMITTER AND METHODS THEREOF

BACKGROUND OF THE INVENTION

Modern systems enable radio transmitters to transmit at reduced power for long periods of time. The modulating signal of these transmissions may have large peak-to-minimum amplitude variations. Since the efficiency of power amplifiers is generally reduced at less-than-maximum power levels, these two factors may increase the average current consumption of power amplifiers in radio transmitters.

There is a continuing need to reduce the current consumption of power amplifiers in radio transmitters.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features and advantages thereof, may best be understood by reference to the following detailed description when read with the accompanying drawings in which:

Figure 1:
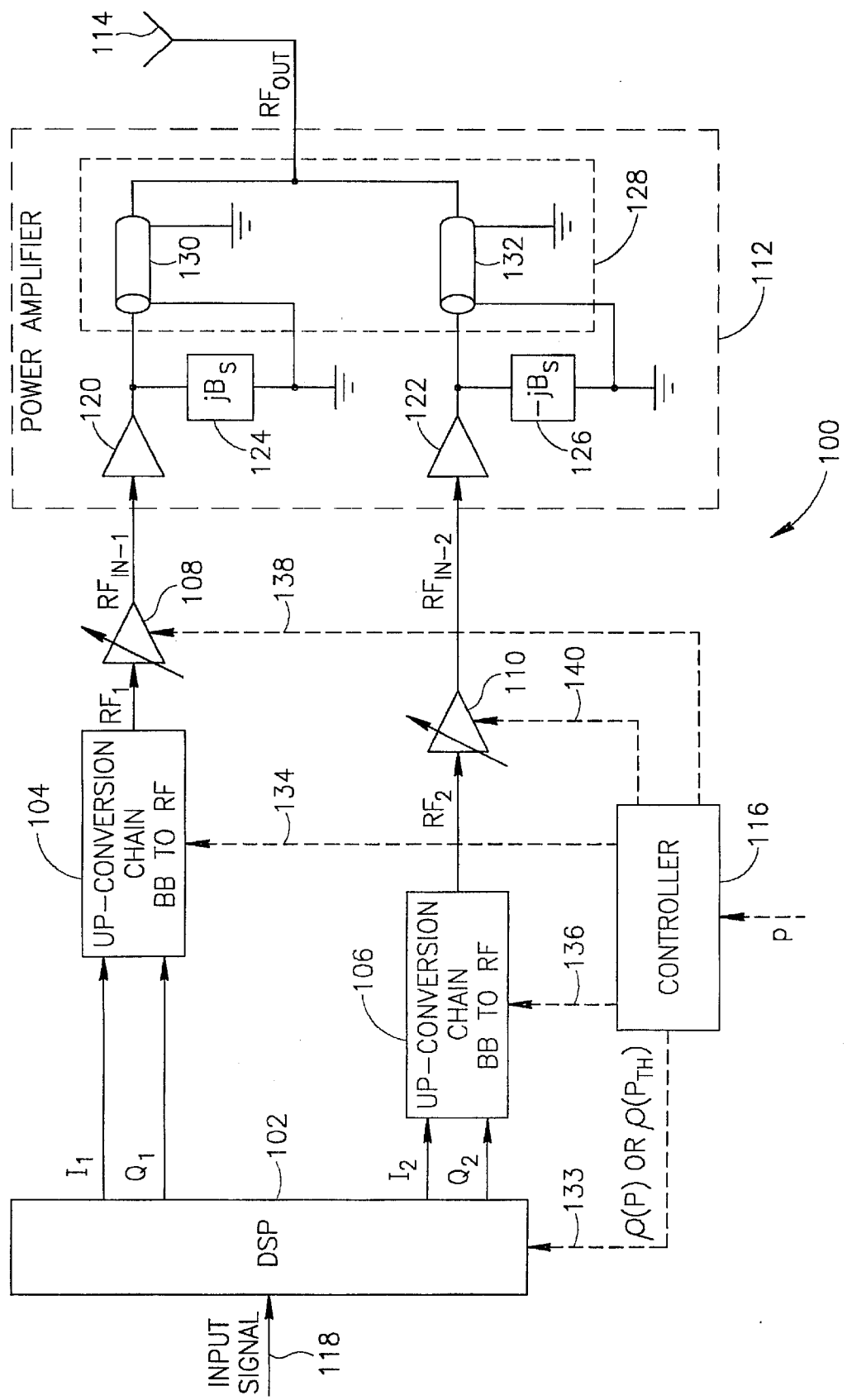
FIG. 1 is a schematic block-diagram illustration of an exemplary radio frequency transmitter, according to an embodiment of the present invention.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE PRESENT INVENTION

In the following detailed description, numerous specific details are set forth in order to provide a thorough understanding of the invention. However it will be understood by those of ordinary skill in the art that the present invention may be practiced without these specific details. In other instances, well-known methods, procedures, components and circuits have not been described in detail so as not to obscure the present invention.

It should be understood that the present invention may be used in a variety of applications. Although the present invention is not limited in this respect, the circuit disclosed herein may be used in many apparatuses such as in the transmitters of a radio system. Radio systems intended to be included within the scope of the present invention include, by way of example only, cellular radiotelephone communication systems, two-way radio communication systems, one-way pagers, two-way pagers, personal communication systems (PCS), and the like.

Types of cellular radiotelephone communication systems intended to be within the scope of the present invention include, although are not limited to, Direct Sequence-Code Division Multiple Access (DS-CDMA) cellular radiotelephone communication systems, Wideband CDMA (WBCDMA) and CDMA2000 cellular radiotelephone systems, Global System for Mobile Communications (GSM) cellular radiotelephone systems, North American Digital Cellular (NADC) cellular radiotelephone systems, Time Division Multiple Access (TDMA) systems, Enhanced Data for GSM Evolution (EDGE) and Universal Mobile Telecommunications Systems (UMTS).

Reference is now made to FIG. 1, in which an exemplary radio frequency (RF) transmitter in accordance with an embodiment of the present invention is described. An RF transmitter 100 may comprise a digital signal processor (DSP) 102, baseband (BB) to RF up-conversion chains 104 and 106, RF preamplifiers 108 and 110, a power amplifier 112, an antenna 114 and a controller 116.

A BB input signal 118 may be provided to DSP 102, which may convert it into two constant envelope vectors according to a method which will be described hereinbelow with respect to FIGS. 2A and 2B. For example, the first constant envelope vector may be represented by baseband signals $I_1$ and $Q_1$, while the second constant envelope vector may be represented by baseband signals $I_2$ and $Q_2$. Up-conversion chain 104 may convert signals $I_1$ and $Q_1$ into an RF signal $RF_1$; similarly up-conversion chain 106 may convert signals $I_2$ and $Q_2$ into an RF signal $RF_2$. RF signals $RF_1$ and $RF_2$ have a common carrier frequency. An exemplary embodiment of up-conversion chains 104 and 106 is described hereinbelow with respect to FIG. 3, although the present invention is in no way limited to this particular exemplary embodiment.

RF preamplifier 108, which has a variable gain, may amplify signal $RF_1$ to produce a signal $RF_{IN-1}$; similarly RF preamplifier 110, which has a variable gain, may amplify signal $RF_2$ to produce a signal $RF_{IN-2}$. Power amplifier 112, which may have reactive termination, may amplify and combine $RF_{IN-1}$ and $RF_{IN-2}$ to produce an output signal $RF_{OUT}$ for transmission by antenna 114.

Power amplifier 112 may comprise two branch amplifiers 120 and 122 connected in parallel, and shunt reactance elements 124 and 126 at the output of branch amplifiers 120 and 122, respectively. $B_S$ denotes the shunt reactance of element 124 and $-B_S$ denotes the shunt reactance of element 126. The efficiency of power amplifier 112 at a specific output signal power may be improved by adjusting the shunt reactance $B_S$. Power amplifier 112 may also comprise a transmission-line-coupler 128 for combining the outputs of branch amplifiers 120 and 122. Transmission-line-coupler 128 may comprise two transmission lines 130 and 132 connected to antenna 114 so that the sum of the branch currents goes through the load. Other combiner schemes yielding the same performance may be implemented instead, namely hybrid BALUN, center tap inductor, etc.

Controller 116 may receive as input a targeted average output signal power level P. Targeted average output signal power level P may be selected from a range of power levels or may be selected from a discrete set of at least two power levels. Controller 116 may provide data related to P to any of DSP 102, up-conversion chains 104 and 106, and RF preamplifiers 108 and 110, with the result that power amplifier 112 may produce an output signal whose average power is substantially equivalent to P. The operation of controller 116 and DSP 102 is better understood if reference is made additionally to FIGS. 2A and 2B, which are schematic illustrations of signal space diagrams. The horizontal axis of the diagram represents the real (in-phase) component of a signal vector, while the vertical axis of the diagram represents the imaginary (quadrature) component.

Figure 2A:
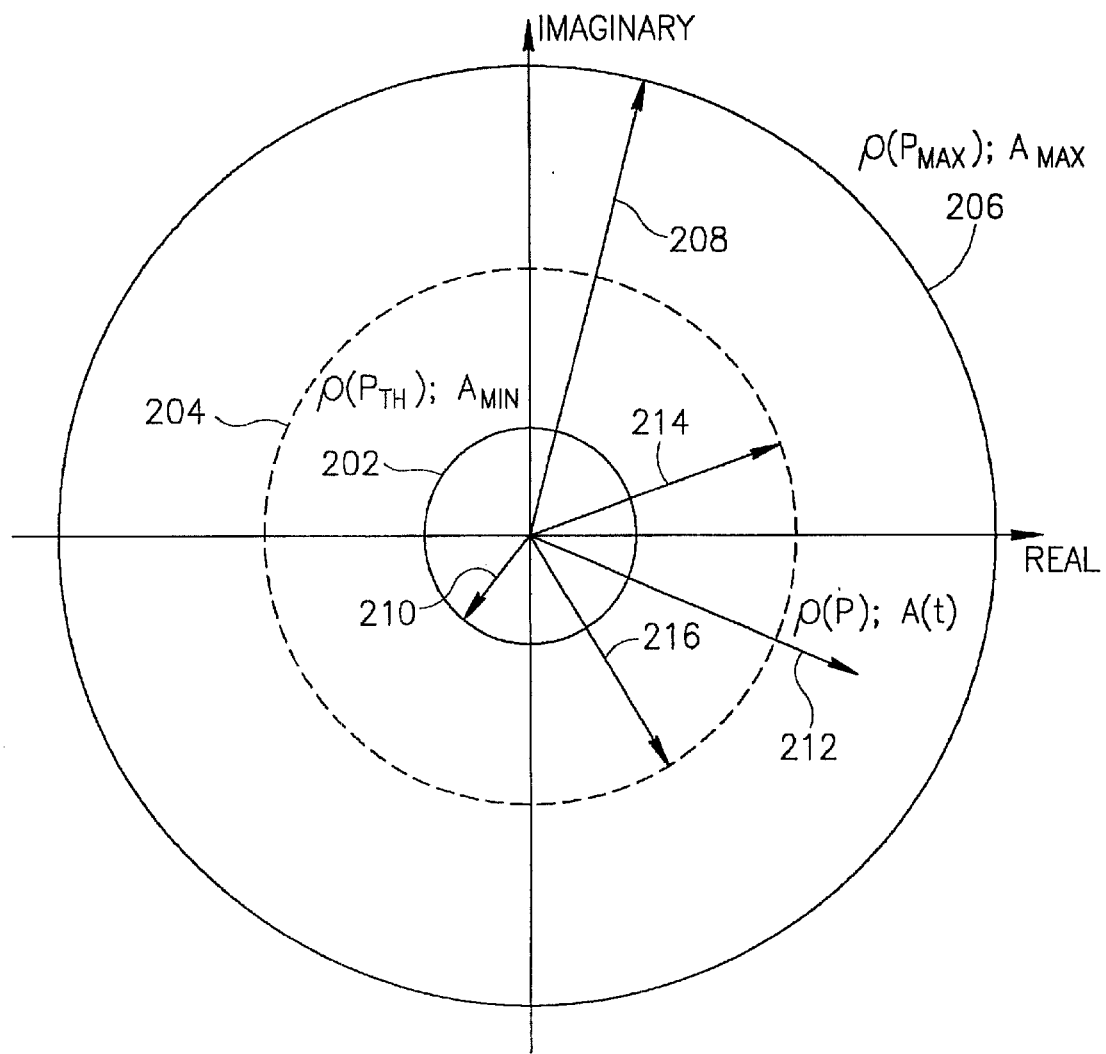
FIGS. 2A and 2B are schematic illustrations of signal space diagrams, helpful in understanding the present invention.

Three concentric circles, 202, 204 and 206, are shown in FIG. 2A. A vector 208 from the center of the diagram to the largest circle 206 represents the amplitude and phase of a BB signal, which after up-conversion and amplification may produce a signal having a maximal instantaneous output signal power. This maximal instantaneous output signal power may be determined both by the maximum amplitude $A_{MAX}$ of input signal 118 (FIG. 1) and by the maximum average power $P_{MAX}$ that power amplifier 112 may be able to produce. Similarly, a vector 210 from the center of the diagram to circle 202 represents the amplitude and phase of a BB signal, which after up-conversion and amplification may produce a signal at an instantaneous output signal power that may be determined both by the minimum amplitude $A_{MIN}$ of input signal 118 and by an average output signal power level $P_{TH}$, the determination of which will be explained hereinbelow.

According to some embodiments of the present invention, when the targeted average output signal power level P is between $P_{MAX}$ and $P_{TH}$, controller 116 may provide DSP 102 with $\rho(P)$ so that DSP 102 may represent a baseband vector 212 by two constant envelope vectors 214 and 216. Since baseband vector 212 has an average amplitude controlled by $\rho(P)$, baseband vector 212 may result, after up-conversion and amplification, in a signal at an average output signal power P and at an instantaneous output signal power determined both by the instantaneous amplitude A(t) of input signal 118 and by the targeted average output signal power level P.

The radius of circle 204 is predetermined both by the maximum amplitude $A_{MAX}$ and by $\rho(P_{MAX})$. The data flow from controller 116 to DSP 102 is indicated in FIG. 1 by line 133, and constant envelope vectors 214 and 216 are represented by the signals $I_1$ and $Q_1$, and $I_2$ and $Q_2$, respectively.

If BB input signal 118 at time t is denoted s(t), with the real (in-phase) component denoted I(t) and the imaginary (quadrature) component denoted Q(t), then the following decomposition holds:

$$s(t)=I(t)+jQ(t).$$

The instantaneous amplitude A(t) of input signal 118 at time t is given as follows:

$$A(t)=\sqrt{I^2(t)+Q^2(t)}.$$

Signals $I_1$ and $Q_1$ are then given by Equations 1A and 1B, as follows:

$$I_1(t) = \sqrt{\rho(P)}\left(I(t) - Q(t)\sqrt{\frac{\rho(P_{MAX}) \cdot A_{MAX}^2}{\rho(P) \cdot A^2(t)} - 1}\right), \quad \text{(Eq. 1A)}$$

$$Q_1(t) = \sqrt{\rho(P)}\left(Q(t) + I(t)\sqrt{\frac{\rho(P_{MAX}) \cdot A_{MAX}^2}{\rho(P) \cdot A^2(t)} - 1}\right), \quad \text{(Eq. 1B)}$$

and signals $I_2$ and $Q_2$ are given by Equations 2A and 2B, as follows:

$$I_2(t) = \sqrt{\rho(P)}\left(I(t) + Q(t)\sqrt{\frac{\rho(P_{MAX}) \cdot A_{MAX}^2}{\rho(P) \cdot A^2(t)} - 1}\right), \quad \text{(Eq. 2A)}$$

$$Q_2(t) = \sqrt{\rho(P)}\left(Q(t) - I(t)\sqrt{\frac{\rho(P_{MAX}) \cdot A_{MAX}^2}{\rho(P) \cdot A^2(t)} - 1}\right). \quad \text{(Eq. 2B)}$$

It will be appreciated by persons of ordinary skill in the art from Equations 1A, 1B, 2A and 2B that the amplitude of the signal represented by $I_1$ and $Q_1$, namely $\sqrt{I_1^2+Q_1^2}$, and the amplitude of the signal represented by $I_2$ and $Q_2$, namely $\sqrt{I_2^2+Q_2^2}$, are both equal to $\sqrt{\rho(P_{MAX})} \cdot A_{MAX}$. It will also be appreciated by persons of ordinary skill in the art that the relative phase differences of these signals are determined from the instantaneous amplitude of input signal 118 and from the targeted average output signal power level P. Clearly the present invention is not limited in any way to the exemplary equations given hereinabove in Equations 1A, 1B, 2A and 2B. Rather, any other set of equations yielding a constant envelope signal represented by signals $I_1$ and $Q_1$, and a constant envelope signal represented by signals $I_2$ and $Q_2$, is clearly also within the scope of the present invention.

According to some embodiments of the present invention, when the targeted average output signal power level P is between $P_{MAX}$ and $P_{TH}$, controller 116 may provide predetermined, fixed values to any amplification elements of up-conversion chains 104 and 106 and to RF preamplifiers 108 and 110. The data flow from controller 116 to up-conversion chains 104 and 106 are indicated in FIG. 1 by lines 134 and 136, respectively. Lines 138 and 140 indicate the data flow from controller 116 to RF preamplifiers 108 and 110, respectively.

Figure 2B:
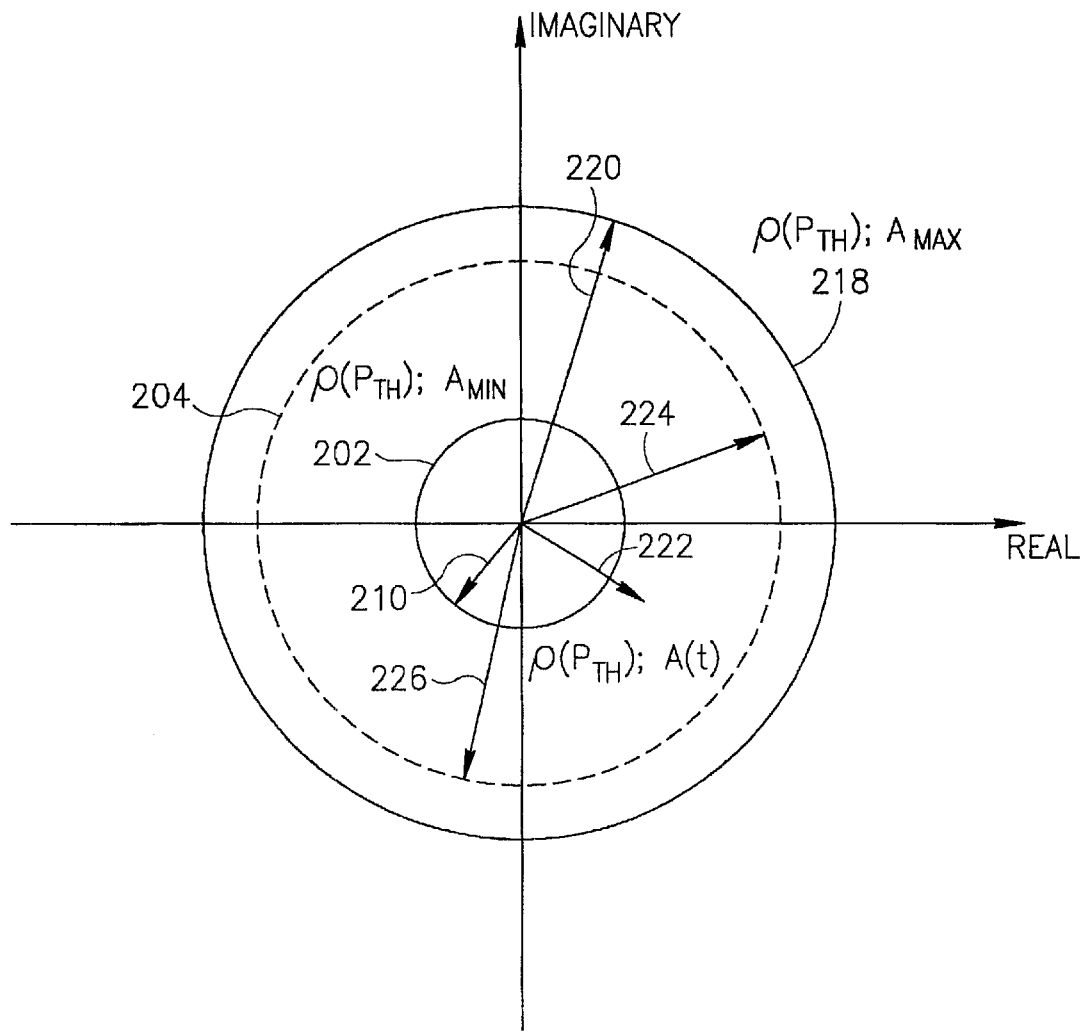

Three concentric circles, 202, 204 and 218, are shown in FIG. 2B. Circles 202 and 204 are the same or similar to those shown in FIG. 2A. A vector 220 from the center of the diagram to circle 218 represents the amplitude and phase of a BB signal, which after up-conversion and amplification may produce a signal at an instantaneous output signal power that may be determined both by the maximum amplitude $A_{MAX}$ of input signal 118 (FIG. 1) and by the average output signal power level $P_{TH}$.

According to some embodiments of the present invention, when the targeted average output signal power level P is less than $P_{TH}$, controller 116 may provide DSP 102 with the power $\rho(P_{TH})$ so that DSP 102 may represent a baseband vector 222 by two constant envelope vectors 224 and 226, where the size of constant envelope 204 is the same or similar to that used in FIG. 2A. Constant envelope vectors 224 and 226 may be represented by signals $I_1$ and $Q_1$, and $I_2$ and $Q_2$, respectively, where Equations 1A, 1B, 2A and 2B are used with $\rho(P_{TH})$ in place of $\rho(P)$. However, baseband vector 222, after up-conversion and amplification at fixed gain values, would produce an output signal at an average output signal power, which may be determined both by the instantaneous amplitude A(t) of input signal 118 and by the predetermined power level $P_{TH}$, and which is higher than the targeted average output signal power level P. Therefore, controller 116 may reduce the amplitudes of signals $I_1$ and $Q_1$, and $I_2$ and $Q_2$, or may reduce the gain of any of variable amplification elements in up-conversion chains 104 and 106 and RF preamplifiers 108 and 110, or a combination thereof, with the result that power amplifier 112 may produce an output signal whose average power is substantially equivalent to P.

The predetermined average output signal power level $P_{TH}$ may act as a threshold between two modes of operation of the RF transmitter, according to some embodiments of the present invention. In one mode, the RF transmitter may control the instantaneous output signal power by combining constant envelope signals whose relative phase differences are determined from the instantaneous amplitude of a baseband input signal and from the targeted average output signal power level P, and by up-converting at a fixed gain. In another mode, the RF transmitter may control the instantaneous output signal power by combining constant envelope signals whose relative phase differences are determined from the instantaneous amplitude of the baseband input signal and from the predetermined average output signal power level $P_{TH}$, and by up-converting at a variable gain which is dependent on the targeted average output signal power level P and which is lower than the fixed gain of the first mode. Alternatively, in this other mode, the RF transmitter may control the instantaneous output signal power by combining constant envelope signals whose relative phase differences are determined from the instantaneous amplitude of the baseband input signal and from the predetermined average output signal power level $P_{TH}$, and whose amplitudes have been reduced in the baseband according to the targeted average output signal power level P, so that the average power of the output signal is substantially equivalent to the targeted average output signal power level P.

Figure 3:
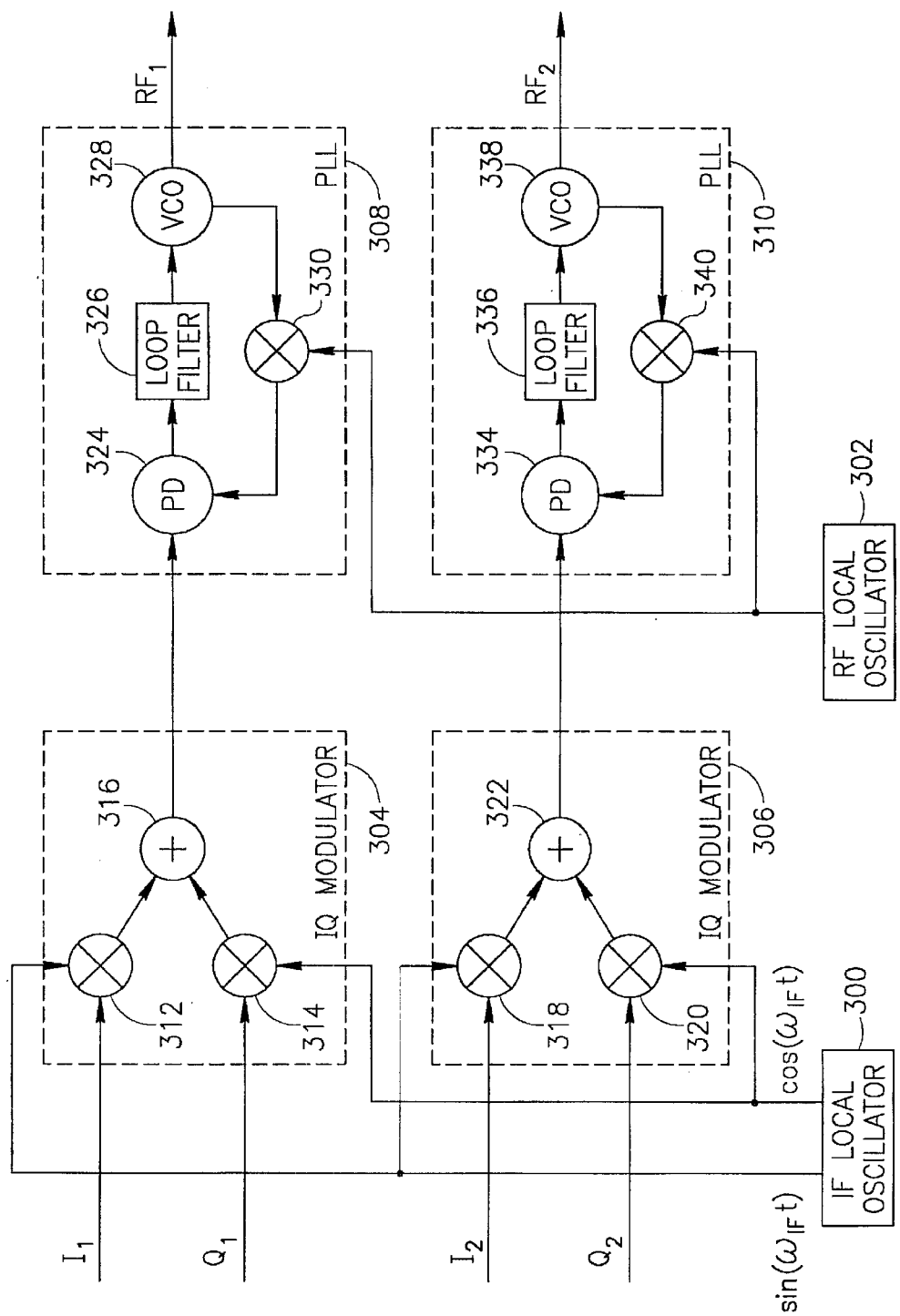
FIG. 3 is a schematic block-diagram illustration of an exemplary up-conversion chain, according to an embodiment of the present invention.

Reference is now made to FIG. 3, which is a schematic block-diagram illustration of an exemplary up-conversion chain, according to an embodiment of the present invention. The up-conversion chain may comprise an intermediate frequency (IF) local oscillator (LO) 300 and an RF local oscillator 302, IQ modulators 304 and 306, and phase lock loops (PLL) 308 and 310.

IQ modulator 304 may comprise mixers 312 and 314 and combiner 316. Mixer 312 may receive as input $I_1$ and $\sin(\omega_{IF}t)$, where $\omega_{IF}$ denotes the frequency generated by IF LO 300 and t denotes time. Mixer 314 may receive as input $Q_1$ and $\cos(\omega_{IF}t)$. Combiner 316 may combine the outputs of mixers 312 and 314, and provides the combination to PLL 308. Similarly, IQ modulator 306 may comprise mixers 318 and 320 and combiner 322. Mixer 318 may receive as input $I_2$ and $\sin(\omega_{IF}t)$. Mixer 320 may receive as input $Q_2$ and $\cos(\omega_{IF}t)$. Combiner 322 may combine the outputs of mixers 318 and 320, and provides the combination to PLL 310.

PLL 308 may comprise a phase detector (PD) 324, a loop filter 326 and a voltage-controlled oscillator (VCO) 328. PLL 308 may also comprise a mixer 330, mixing the output of VCO 328 with the signal produced by RF LO 302, and providing an IF modulated signal to PD 324. Similarly, PLL 310 may comprise a PD 334, a loop filter 336 and a VCO 338. PLL 310 may also comprise a mixer 340, mixing the output of VCO 338 with the signal produced by RF LO 302, and providing an IF modulated signal to PD 334.

Alternatively, the up-conversion chain may comprise variable amplifiers (not shown) that amplify the input signals $I_1$ and $Q_1$, and $I_2$ and $Q_2$, prior to their modulation by IQ modulators 304 and 306, respectively. The gain of these variable amplifiers may be reduced by controller 116 (not shown) when the targeted average output signal power level P is less than the predetermined power level $P_{TH}$.

Figure 4C:
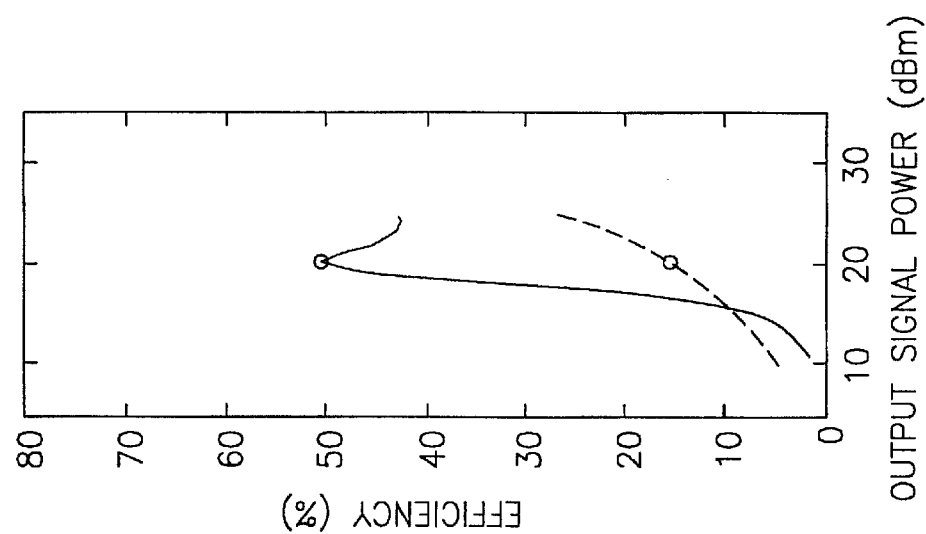
FIGS. 4A, 4B and 4C are exemplary graphical illustrations of the instantaneous efficiency of the radio frequency transmitter of FIG. 1 and of a conventional class-B power amplifier as a function of the instantaneous output signal power due to the amplitude of the modulating signal.
Figure 4B:
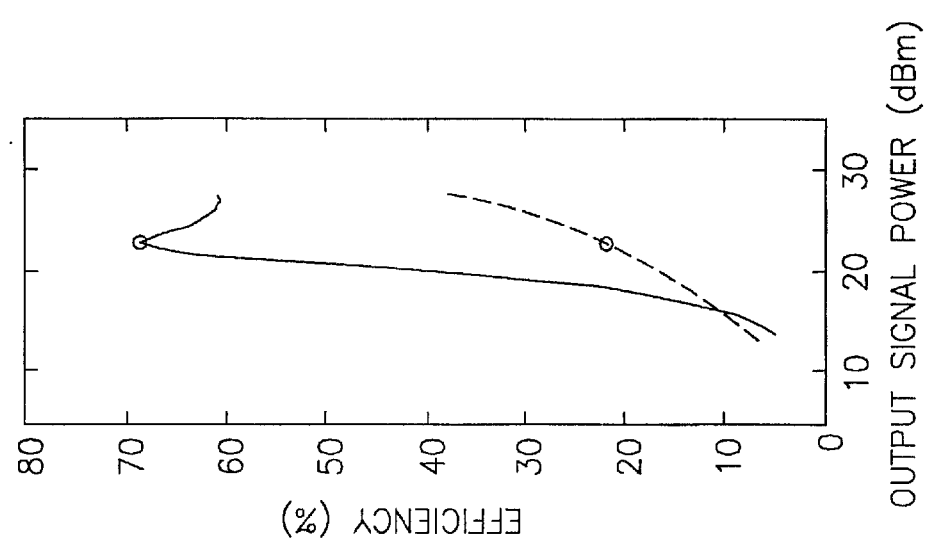
Figure 4A:
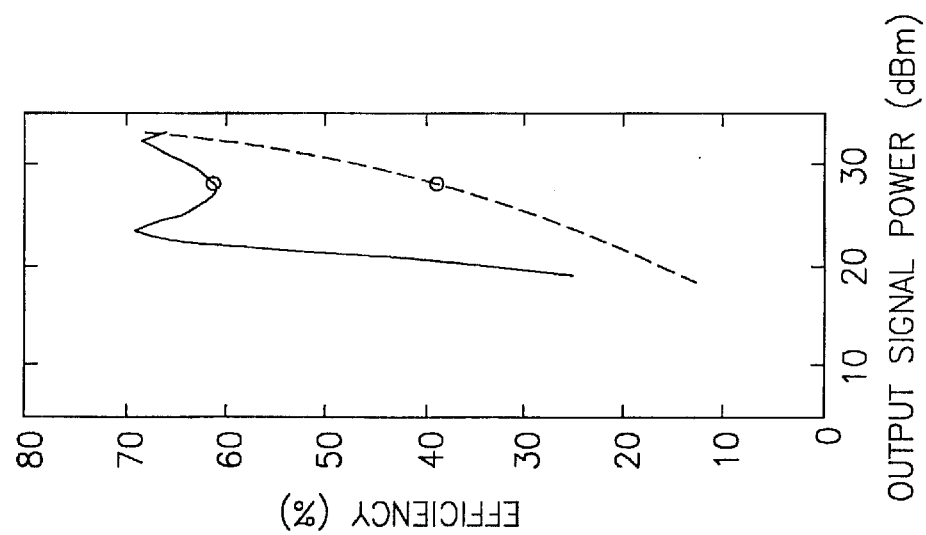

Reference is now made to FIGS. 4A, 4B and 4C, which are exemplary graphical illustrations of the instantaneous efficiency of the radio frequency transmitter of FIG. 1 (indicated by a solid line) and of a conventional class-B power amplifier (indicated by a dotted line) as a function of the output signal power. In FIG. 4A the average output signal power (indicated by a circle) is $P_{MAX}$, and the instantaneous output signal power (indicated by the solid and dotted lines) varies according to the amplitude of the input signal. In FIG. 4B the average output signal power is $P_{TH}$, and in FIG. 4C the average output signal power is less than $P_{TH}$. The average current consumption of the RF transmitter of FIG. 1 may be appreciably reduced with respect to that of class-B power amplifiers.

As shown in the exemplary graphical illustrations of FIGS. 4B and 4C, $P_{TH}$ is chosen to be the average output signal power at which the efficiency has a peak value. However, it will be appreciated that there are many other ways to select the threshold $P_{TH}$, all of which are included in the scope of the present invention. For example, the threshold $P_{TH}$ may be chosen by minimizing the current consumption according to the output signal power probability distribution and the amplitude distribution of the baseband input signal.

Figure 5:
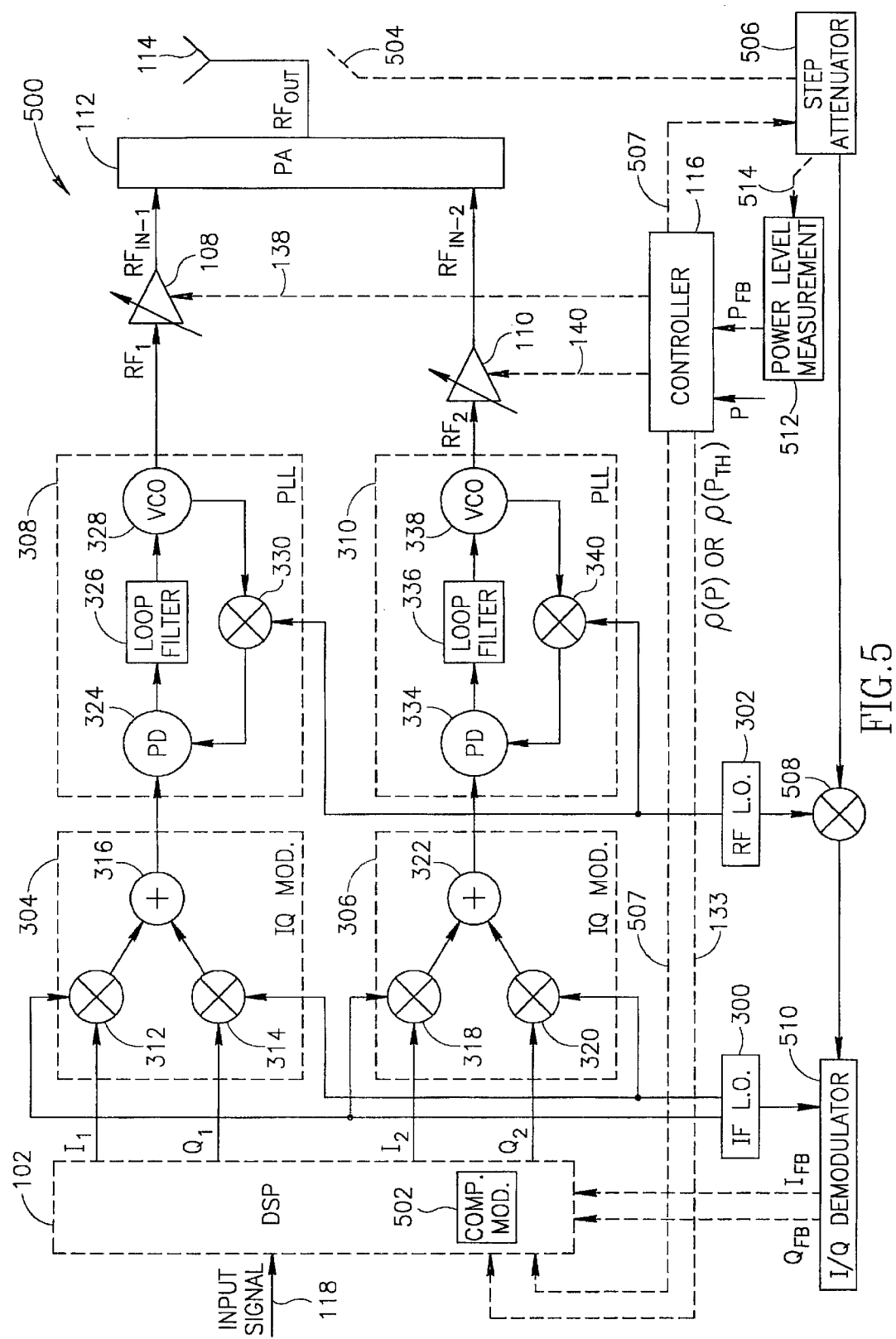
FIG. 5 is a schematic block-diagram illustration of an exemplary radio frequency transmitter, according to another embodiment of the present invention.

Reference is now made to FIG. 5, which is a schematic block-diagram illustration of an exemplary radio frequency transmitter, according to another embodiment of the present invention.

An RF transmitter 500 may comprise DSP 102, RF preamplifiers 108 and 110, power amplifier 112, antenna 114 and controller 116. As in FIG. 1, BB input signal 118 may be provided to DSP 102. RF transmitter 500 may also comprise IF local oscillator 300, RF local oscillator 302, IQ modulators 304 and 306, and PLLs 308 and 310.

RF transmitter 500 may also comprise a feedback path to compensate for circuit imperfections that may occur in an open loop arrangement such as that of FIG. 1. In this embodiment, DSP 102 may comprise a compensation module 502. A small portion of the transmitted signal $RF_{OUT}$ may be taken through a directional coupler 504 via a step attenuator 506. The state of step attenuator 506 may be controlled by controller 116, as indicated by line 507, in order to divide the entire dynamic range into several smaller regions. The output of step attenuator 506 passes through an image rejection mixer (IRM) 508. IRM 508 down-converts the RF signal to IF. IRM 508 may receive as input, in addition to the RF signal, a signal from RF local oscillator 302. The IF signal produced by IRM 508 may be demodulated by an I/Q demodulator 510, which may receive as input a signal from IF local oscillator 300. I/Q demodulator 510 may produce feedback signals $I_{FB}$ and $Q_{FB}$, which may be provided to DSP 102 through analog-to-digital converters (not shown).

As indicated by line 133, controller 116 may provide DSP 102 with a power level ρ. As explained hereinabove, when the targeted average output signal power level P is in a first range of average output signal power levels, i.e. between $P_{MAX}$ and $P_{TH}$, then the power level ρ is related to the targeted average output signal power level P. When the targeted average output signal power level P is in a second range of average output signal power levels, i.e. less than $P_{TH}$, then the power level ρ is related to the predetermined average output signal power level $P_{TH}$.

Compensation module 502 may compare the input signal 118, the feedback signals $I_{FB}$ and $Q_{FB}$, the power level ρ and the state 507 of step attenuator 506 to create the compensated baseband signals $I_1$ and $Q_1$, and $I_2$ and $Q_2$.

RF transmitter 500 may also comprise a power level measurement unit 512 that may take a small portion of the output of step attenuator 506 through a directional coupler 514. Power level measurement unit 512 may provide a measured power level $P_{FB}$ to controller 116. Controller 116 may compare the targeted output signal power level with measured power level $P_{FB}$ in order to set the targeted amplification values for RF preamplifiers 108 and 110 and for the amplification elements in the up-conversion chains.

In another embodiment of the present invention, signals $I_1$ and $Q_1$ are given by Equations 3A and 3B, as follows:

$$I_1(t) = \sqrt{\rho(P)}\left(I(t) - Q(t)\sqrt{\frac{\rho(P_{MAX})}{\rho(P)} - 1}\right), \quad \text{(Eq. 3A)}$$

$$Q_1(t) = \sqrt{\rho(P)}\left(Q(t) + I(t)\sqrt{\frac{\rho(P_{MAX})}{\rho(P)} - 1}\right), \quad \text{(Eq. 3B)}$$

and signals $I_2$ and $Q_2$ are given by Equations 4A and 4B, as follows:

$$I_2(t) = \sqrt{\rho(P)}\left(I(t) + Q(t)\sqrt{\frac{\rho(P_{MAX})}{\rho(P)} - 1}\right), \quad \text{(Eq. 4A)}$$

$$Q_2(t) = \sqrt{\rho(P)}\left(Q(t) - I(t)\sqrt{\frac{\rho(P_{MAX})}{\rho(P)} - 1}\right). \quad \text{(Eq. 4B)}$$

It will be appreciated by persons of ordinary skill in the art from Equations 3A, 3B, 4A and 4B that the amplitude of the signal represented by $I_1$ and $Q_1$, namely $\sqrt{I_1^2+Q_1^2}$, and the amplitude of the signal represented by $I_2$ and $Q_2$, namely $\sqrt{I_2^2+Q_2^2}$, are both equal to $\sqrt{\rho(P_{MAX})\cdot(I^2+Q^2)}$. That is, their amplitude depends on the amplitude of the input signal and the maximal average output signal power and does not depend on the average output signal power. These signals are constant envelope signals only if the input signal is a constant envelope signal. It will also be appreciated by persons of ordinary skill in the art that the relative phase differences of these signals are determined from the targeted average output signal power level P and not from the instantaneous amplitude of input signal 118.

Figure 6A:
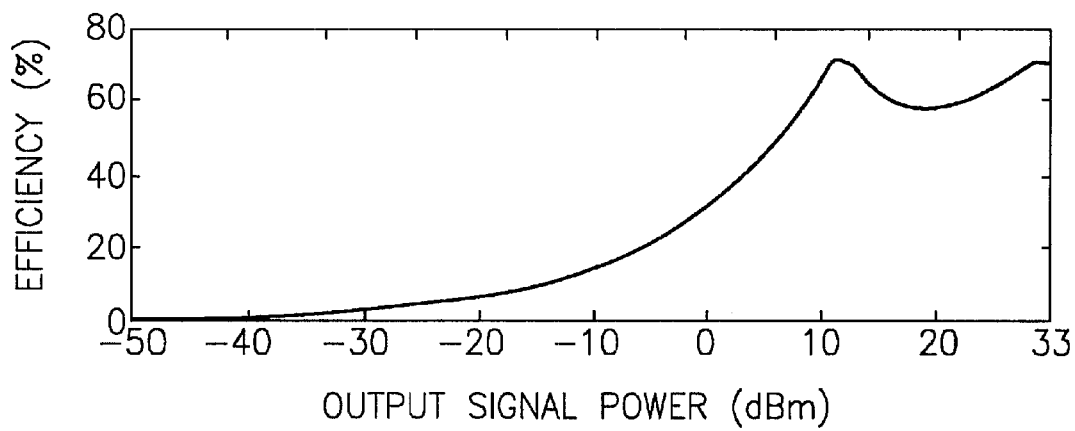
FIG. 6A is an exemplary graphical illustration of the instantaneous efficiency of the radio frequency transmitter of FIG. 1 for a constant envelope signal as a function of the output signal power, according to another embodiment of the present invention.

According to this embodiment, if the amplitude of baseband input signal 118 is constant, an exemplary graphical illustration of the efficiency of the radio frequency transmitter of FIG. 1 as a function of the output signal power is shown in FIG. 6A, to which reference is now made. The efficiency has a peak at two output signal powers. The predetermined average output signal power level $P_{TH}$ may be set to be close to the lower of these output signal powers having a peak efficiency.

Figure 6B:
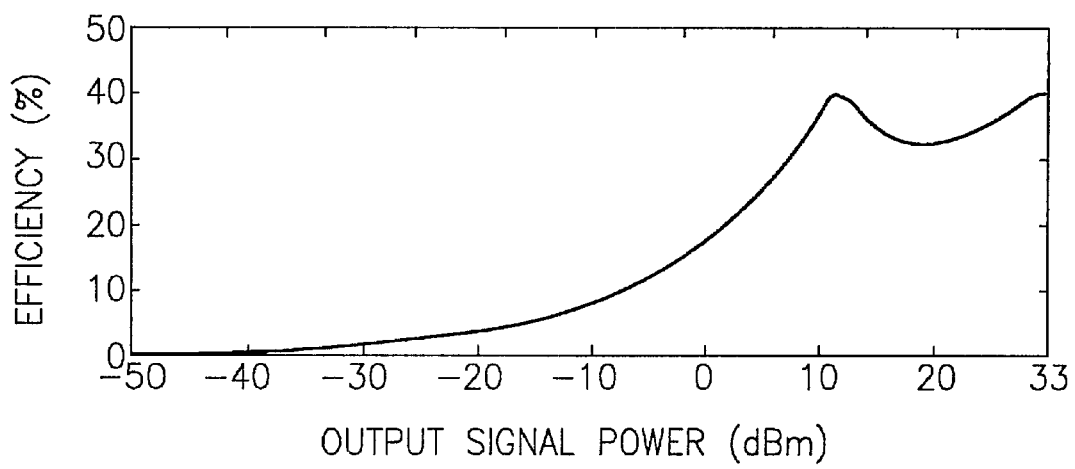
FIG. 6B is an exemplary graphical illustration of the instantaneous efficiency of the radio frequency transmitter of FIG. 1 for a non-constant envelope signal as a function of the output signal power, according to a further embodiment of the present invention.

If the amplitude of baseband input signal 118 is not constant, the amplitudes of baseband signals $I_1$ and $Q_1$, and $I_2$ and $Q_2$, are determined from the instantaneous amplitude A(t) of baseband input signal 118, and the relative phase differences of baseband signals $I_1$ and $Q_1$, and $I_2$ and $Q_2$, are determined from the targeted output signal power level P. The average efficiency of the radio frequency transmitter of FIG. 1 for this embodiment as a function of the output signal power is shown in FIG. 6B.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

What is claimed is:

1. A method comprising:
   when a targeted power level is below a predetermined power level:
   generating baseband signals having relative phase differences, said relative phase differences determined from an instantaneous amplitude of an input signal and from said predetermined power level, the amplitude of said baseband signals being determined, at least in part, from said targeted power level; and
   combining signals derived from said generated signals into an output signal having an average power that is substantially equivalent to said targeted power level, said derived signals having a common carrier frequency.

2. The method of claim 1, wherein generating said signals includes processing said output signal.

3. A method comprising:
   varying according to a targeted power level amplitudes of signals having a common carrier frequency and having relative phase differences, said targeted power level selected from at least two power levels, said relative phase differences determined from an instantaneous amplitude of an input signal and from a predetermined power level; and
   combining said amplitude-varied signals into an output signal having an average power that is substantially equivalent to said targeted power level.

4. The method of claim 3, wherein combining said amplitude-varied signals comprises combining said amplitude-varied signals with reactive termination.

5. A method comprising:
   generating signals having a common carrier frequency and having relative phase differences, said relative phase differences determined from an instantaneous amplitude of an input signal and from a predetermined power level;
   varying amplitudes of signals derived from said generated signals according to a targeted power level, said targeted power level selected from at least two power levels; and
   combining said amplitude-varied signals into an output signal having an average power that is substantially equivalent to said targeted power level.

6. The method of claim 5, wherein generating said signals includes processing said output signal.

7. A method comprising:
   combining signals having a common carrier frequency and having relative phase differences into an output signal having an average power that is substantially equivalent to a targeted power level, said relative phase differences determined from an instantaneous amplitude of an input signal,
   wherein if said targeted power level is in a first range of average output signal power levels, said relative phase differences are further determined from said targeted power level, and
   wherein if said targeted power level is in a second range of average output signal power levels, said relative phase differences are further determined from a predetermined power level and said method further comprises varying amplitudes of said signals according to said targeted power level prior to combining said signals.

8. The method of claim 7, wherein said first range and said second range are separated by a threshold power level.

9. A method comprising:
when a targeted power level is below a predetermined power level:
generating baseband signals having relative phase differences, said relative phase differences determined from said predetermined power level, the amplitude of said baseband signals being determined, at least in part, from said targeted power level; and
combining signals derived from said baseband signals into an output signal having an average power that is substantially equivalent to said targeted power level, said derived signals having a common carrier frequency.

10. The method of claim 9, wherein generating said baseband signals includes processing said output signal.

11. A method comprising:
generating baseband signals having relative phase differences, said relative phase differences determined from a predetermined average output signal power level;
varying amplitudes of signals derived from said baseband signals according to a targeted power level, said targeted power level selected from at least two power levels, said derived signals having a common carrier frequency; and
combining said amplitude-varied signals into an output signal having an average power that is substantially equivalent to said targeted power level.

12. The method of claim 11, wherein generating said baseband signals includes processing said output signal.

13. A method comprising:
generating baseband signals having relative phase differences; and
combining signals derived from said baseband signals into an output signal having an average power that is substantially equivalent to a targeted power level, said derived signals having a common carrier frequency,
wherein if said targeted power level is in a first range of average output signal power levels, said relative phase differences are determined from said targeted power level, and
wherein if said targeted power level is in a second range of average output signal power levels, said relative phase differences are determined from a predetermined power level and the method further comprises varying amplitudes of said signals derived from said baseband signals prior to combining said signals derived from said baseband signals.

14. The method of claim 13, wherein generating said baseband signals includes processing said output signal.

15. An apparatus comprising:
a processor adapted to receive a predetermined power level, said processor further adapted to generate signals having a common carrier frequency and having relative phase differences, said relative phase differences determined from said predetermined power level and from an instantaneous amplitude of a baseband input signal.

16. The apparatus of claim 15, wherein said processor is a digital signal processor.

17. An apparatus comprising:
a processor adapted to receive a power level, said processor further adapted to generate signals having a common carrier frequency and having relative phase differences, said relative phase differences determined from said received power level and from an instantaneous amplitude of a baseband input signal; and
a controller to provide said processor with said received power level, said received power level related to a predetermined power level when a targeted power level is in a first range of average output signal power levels, and said received power level related to said targeted power level when said targeted power level is in a second range of average output signal power levels.

18. The apparatus of claim 17, wherein said processor is a digital signal processor.

19. An apparatus comprising:
a processor adapted to receive a power level, said processor adapted to generate baseband signals having relative phase differences, said relative phase differences determined from said received power level; and
a controller to provide said processor with said received power level, said received power level related to a predetermined power level when a targeted power level is in a first range of average output signal power levels, and said received power level related to said targeted power level when said targeted power level is in a second range of average output signal power levels.

20. The processor of claim 19, wherein said processor is a digital signal processor.

21. A transmitter comprising:
a processor adapted to receive a power level, said processor further adapted to generate signals having a common carrier frequency and having relative phase differences, said relative phase differences determined from said received power level and from an instantaneous amplitude of a baseband input signal;
a controller to provide said processor with said received power level, said received power level related to a predetermined power level when a targeted power level is in a first range of average output signal power levels, and said received power level related to said targeted power level when said targeted power level is in a second range of average output signal power levels; and
a power amplifier adapted to combine signals derived from said generated signals into an output signal having an average power that is substantially equivalent to said targeted power level, wherein said output signal is compatible for use in a cellular communications system.

22. The transmitter of claim 21, further comprising:
at least one variable gain amplifier; and
a controller coupled to said at least one variable gain amplifier and adapted to adjust said variable gain amplifier in accordance with said targeted power level.

23. The transmitter of claim 21, wherein said processor is adapted to process said output signal when generating said generated signals.

24. A transmitter comprising:
a processor adapted to receive a power level, said processor further adapted to generate baseband signals having relative phase differences, said relative phase differences determined from said received power level;
a controller to provide said processor with said received power level, said received power level related to a predetermined power level when a targeted power level is in a first range of average output signal power levels, and said received power level related to said targeted power level when said targeted power level is in a second range of average output signal power levels; and a power amplifier adapted to combine signals having a common carrier frequency derived from said baseband signals into an output signal having an average power that is substantially equivalent to said targeted power level, wherein said output signal is compatible for use in a cellular communications system.

25. The transmitter of claim 24, further comprising:

at least one variable gain amplifier; and a controller coupled to said at least one variable gain amplifier and adapted to adjust said variable gain amplifier in accordance with said targeted power level.

26. The transmitter of claim 24, wherein said processor is adapted to process said output signal when generating said baseband signals.

* * * * *